(12) United States Patent
Hosonuma et al.

(10) Patent No.: US 7,468,121 B2
(45) Date of Patent: Dec. 23, 2008

(54) CONDUCTIVE DIAMOND ELECTRODE AND PROCESS FOR PRODUCING THE SAME

(75) Inventors: Masashi Hosonuma, Fujisawa (JP);
Masaharu Uno, Fujisawa (JP);
Tomoyasu Shibata, Fujisawa (JP);
Yoshinori Nishiki, Fujisawa (JP);
Tsuneto Furuta, Fujisawa (JP)

(73) Assignee: Permelec Electrode Ltd., Kanagawa (JP)

( * ) Notice: Subject to any disclaimer, the term of this patent is extended or adjusted under 35 U.S.C. 154(b) by 88 days.

(21) Appl. No.: 11/496,394

(22) Filed: Aug. 1, 2006

(65) Prior Publication Data

US 2007/0031694 A1 Feb. 8, 2007

(30) Foreign Application Priority Data

Aug. 1, 2005 (JP) .......................... P.2005-222974

(51) Int. Cl.
*C25B 11/12* (2006.01)

(52) U.S. Cl. ............. 204/290.12; 204/280; 204/290.01; 204/290.15; 204/294

(58) Field of Classification Search ................ 204/280, 204/290.01, 290.12, 290.15, 294
See application file for complete search history.

(56) References Cited

U.S. PATENT DOCUMENTS

| | | | | |
|---|---|---|---|---|
| 5,593,556 | A * | 1/1997 | Kumagai et al. | ....... 204/290.08 |
| 7,273,536 | B2 * | 9/2007 | Shibata et al. | .............. 204/294 |
| 2006/0124349 | A1 * | 6/2006 | Fujimura et al. | ............ 174/256 |

* cited by examiner

*Primary Examiner*—Bruce F Bell
(74) *Attorney, Agent, or Firm*—Sughrue Mion, PLLC

(57) ABSTRACT

The present invention provides a conductive diamond electrode having: a conductive substrate; a coating layer formed on a surface of the conductive substrate, the coating layer containing one of a metal and an alloy each including at least one of niobium and tantalum; and a conductive diamond layer formed on a surface of the coating layer, and a process for producing the conductive diamond electrode.

5 Claims, 1 Drawing Sheet

CONDUCTIVE DIAMOND ELECTRODE AND PROCESS FOR PRODUCING THE SAME

FIELD OF THE INVENTION

The present invention relates to a conductive diamond electrode and a process for producing the electrode. More particularly, the invention relates to a diamond electrode with which substances contained in wastewaters, raw water for drinking water, or the like and exerting adverse influences on the industry, human body, and environment can be efficiently electrolyzed and which is excellent in durability and economical efficiency when used as an anode for the electrolytic synthesis of ozone, persulfuric acid, percarbonic acid, or the like.

BACKGROUND OF THE INVENTION

An electrolytic process is a process in which electrical energy, which is a clean energy, is utilized to conduct chemical reactions on the electrode surfaces while controlling the reactions. When applied to aqueous solution systems, the process can generate hydrogen, oxygen, ozone, hydrogen peroxide, etc. In industrial electrolysis, the process is a basic technique generally used for the electrolysis of sodium chloride, electroplating, metal collection, etc. Recently, the process is coming to be utilized for wastewater treatment because it can indirectly decompose organic pollutants or directly electrolyze the pollutants after adsorption thereof onto an electrode.

On the other hand, it is known that in electrolysis, oxidation reactions at the anode yield an oxidizing agent (e.g., effective chlorine or ozone) effective in water treatment and partly generate active species such as OH radicals. Water containing these components is in general use under the name of active water, functional water, ion water, sterilization water, etc. Recently, this water has come to be called exclusively as electrolytic water.

Although electrolytic processes are being practically used as shown above, it has been pointed out that intended reactions do not sufficiently proceed depending on the electrode materials. In general, anodic oxidation in the electrolysis of an aqueous solution yields an electrolysis product from water. However, when the electrode catalyst used has high reactivity in the electric discharge of water, there are often cases where the oxidation of coexistent substances does not readily proceed.

Examples of the electrode materials for use in electrolytic electrodes (anodes) for oxidation include lead oxide ($PbO_2$), tin oxide ($SnO_2$), platinum (Pt), DSAs, and carbon. In order for a material to be usable as an electrode substrate, it should have corrosion resistance so as to secure a long life and not to foul the surface to be treated. Usually, the anode feeders are limited to valve metals such as titanium and alloys thereof, and the electrode catalysts also are limited to noble metals such as platinum (Pt) and iridium (Ir) and oxides thereof. It is, however, known that even when such expensive materials are used, they are consumed depending on the density of the current applied and on the lapse of time and dissolve away in the solution. There is hence a desire for an electrode having better corrosion resistance.

Graphite and amorphous carbon materials have been used as electrode materials. However, these materials are consumable and are highly consumed especially in anodic polarization. Diamond is excellent in thermal conductivity, optical transparency, and resistance to high temperatures and oxidation, and the electrical conductivity thereof can be regulated especially by doping. Diamond is hence regarded as a promising material for use in semiconductor devices and energy conversion elements.

Swain et al. [Journal of Electrochemical Society, Vol. 141, 3382-(1994)] recently reported that diamond used as an electrode for electrochemical use is stable in an acid electrolytic solution and suggested that diamond is far superior to other carbon materials. Basic electrochemical properties are described in detail in Denkikagaku Kai-shi, p. 521, Vol. 72, No. 7 (2004).

U.S. Pat. No. 5,399,247 suggests that use of diamond as an anode material enables the decomposition of organic wastewaters. JP-A-2000-226682 proposes a method in which conductive diamond is used as an anode and a cathode to electrochemically treat an organic matter. JP-A-2000-254650 proposes a method in which a conductive diamond electrode and a gas diffusion cathode for hydrogen peroxide generation are used as an anode and a cathode, respectively, to treat water. Recently, a technique in which a diamond electrode is used for the synthesis of electrolytic water and ozone gas was disclosed (JP-A-11-269685).

It can be expected from those investigations that the electrolytic processes employing diamond as an electrode attain a higher efficiency than in processes employing conventional electrodes. However, improvements have been desired as shown below from the standpoint of practical use.

Methods which have been developed for diamond layer formation are hot-filament CVD, microwave plasma CVD, the plasma arc jet method, PVD, and the like. In the CVD synthesis method, which is a general process for producing a diamond layer, it is required that the substrate should have a thermal expansion coefficient close to that of diamond became the target layer is formed through a high-temperature reduction step conducted at about 700° C. or higher.

Semiconducting silicon which is single-crystalline or polycrystalline is generally used as the substrates of diamond electrodes because the thermal expansion coefficient thereof is close to that of diamond. However, this material has poor mechanical strength and is limited in size. It is therefore difficult to use this substrate material for size enlargement. Since the electrodes for use in industrial electrolysis have complicated shapes, it is after all preferred to employ a metallic substrate which is easy to process and has high mechanical strength. Known as electrode substrate substitutes are carbon, valve metals, Ta, Nb, Ni, Mo, W, and carbides thereof.

In the case where diamond is used in an electrode, the material of the substrate thereof preferably is one which, when the electrode is used as an anode, is stable at noble potentials and on which a stable passive-state film is formed. In particular, a valve metal can be used as a metal which is stable in acid solutions in an anode potential region. Use of a niobium or tantalum substrate is being investigated partly because of its property of being less apt to yield hydrides in a hydrogen atmosphere.

However, niobium has an unsolved problem that this metal as a substrate is expensive. Compared to niobium, tantalum is closer to diamond in the thermal expansion coefficient (6 times). Tantalum hence shows better suitability for bonding to a diamond layer and is expected to bring about improved stability. However, tantalum is even more expensive than niobium and is hence unsuitable for practical use. Furthermore, the specific gravities of niobium and tantalum are 8.56 and 16.60, respectively, and are far higher than those of other metals, e.g., 4.54 for titanium, and this has been an obstacle to the practical use of a large electrode.

On the other hand, titanium is relatively far inexpensive (from 1/10 to 1/20 the cost of niobium) and has a high value of specific strength, i.e., strength/specific gravity. Titanium can be relatively easily extended by rolling, etc., and processing techniques such as, e.g., cutting have been established. Investigations on the use of titanium as a diamond substrate are being made and this substrate is utilized. However, since diamond is generally synthesized in a high-temperature reducing hydrogen atmosphere, use of a titanium substrate has a drawback that when the titanium surface is directly exposed to the atmosphere, there are cases where a hydride generates depending on the synthesis conditions and the hydride penetrates into and is occluded in the substrate to impair the stability of the substrate. In addition, the thermal expansion coefficient of titanium (9 times) considerably differs from that of diamond.

To form an interlayer of, e.g., a carbide on the substrate surface for the purposes of adhesion and substrate protection is preferred (JP-A-9-268395). However, most of such interlayers have poor resistance to electrolytic corrosion.

For providing a stable anode, it is required to improve the durability of a substrate and maintain it.

In the DSEs for use as anodes for industrial electrolysis which employ a noble metal as a catalyst, titanium or a titanium alloy is generally used as the substrates. The effect of an interlayer has been disclosed from long ago as a basic technique for prolonging the life of noble-metal oxide electrodes (DSEs) in acid electrolytic baths (Japanese Patent No. 1296411). In the case of a diamond electrode, however, the oxide interlayer is mostly reduced because radicals of, e.g., hydrogen generate under the CVD diamond synthesis conditions, making it difficult to utilize that technique.

On the other hand, Japanese Patent No. 2761751 discloses a technique in which a thin layer of a metal or alloy composition is formed as an interlayer on a substrate having poor corrosion resistance in producing an anode for oxygen generation to thereby improve corrosion resistance. The interlayer technology has been developed with regard to DSEs, and effectiveness thereof in processes for synthesizing diamond catalyst electrodes has not yet been reported or disclosed so far.

Under these circumstances, it has been required to develop a diamond electrode which has durability, can be easily made to have a large size, and can be utilized for industrial electrolysis.

SUMMARY OF THE INVENTION

Accordingly, an object of the present invention is to provide a conductive diamond electrode comprising a conductive substrate and a conductive diamond layer and having a coating layer which protects the substrate to enable a long-term stable operation.

The present inventors have made eager investigation to examine the problem. As a result, it has been found that the foregoing object can be achieved by the following conductive diamond electrode and process for producing the conductive diamond electrode. With this finding, the present invention is accomplished.

The present invention is mainly directed to the following items:

1. A conductive diamond electrode comprising: a conductive substrate; a coating layer formed on a surface of the conductive substrate, the coating layer comprising one of a metal and an alloy each comprising at least one of niobium and tantalum; and a conductive diamond layer formed on a surface of the coating layer.

2. The conductive diamond electrode according to item 1, wherein the conductive substrate comprises one of titanium and a titanium alloy.

3. The conductive diamond electrode according to item 1, wherein the coating layer has a content of the at least one of niobium and tantalum of 20 to 100 at.%.

4. The conductive diamond electrode according to item 1, wherein the surface of the coating layer has concavo-convex portions each having a diameter of 30 to 150 nm.

5. The conductive diamond electrode according to item 1, wherein the alloy further contains at least one element selected from the group consisting of Ti, Zr, Mo, W, V, Sn, Ag, Al, Ni, Cu, Si, B, C, and O.

6. A process for producing a conductive diamond electrode, the process comprising: forming a coating layer on a surface of a conductive substrate by at least one method selected from the group consisting of hot dipping method, CVD method, PVD method and brazing method, the coating layer comprising one of a metal and an alloy each comprising at least one of niobium and tantalum; and forming a conductive diamond layer on a surface of the coating layer.

The invention will be explained below in detail.

Although conductive diamond electrodes generally employ a conductive silicon substrate, they have been difficult to be produced in an increased size. It is known that these electrodes, especially when used as anodes, become unstable and have a reduced life because of the corrosive liquid in which the electrodes are immersed and of a high potential. On the other hand, titanium is inexpensive and is being used as a diamond electrode substrate or this use is being investigated. However, since diamond synthesis is generally conducted in a high-temperature reducing hydrogen atmosphere, the large difference in the thermal expansion coefficient between titanium and diamond may be problematic and there are cases where a hydride generates and is occluded depending on the synthesis conditions. Consequently, catalyst separation is apt to occur when the electrode is used as an anode.

Niobium and tantalum are stable to high-temperature reducing atmospheres and can be expected to show improved stability when used as a diamond electrode substrate. However, these metals are expensive and hence unsuitable for practical use.

In the invention, a coating layer comprising a metal or an alloy (hereinafter referred to as metal or alloy coating layer) each comprising at least one of niobium and tantalum, which are expensive, is formed between the substrate made of, e.g., titanium, which is relatively inexpensive, and a conductive diamond layer. The niobium or tantalum contributes to an improvement in the stability of the inexpensive substrate and thereby enables a considerable cost reduction as compared with the case where the substrate itself is constituted of niobium or tantalum.

The reasons for this are as follows. Niobium and tantalum, which themselves are metals having high resistance to electrolytic oxidation and excellent corrosion resistance, can be used as substrates for diamond synthesis or industrial electrode materials. Practically, however, these metals cannot be used as industrial electrodes from the standpoints of thickness and cost. Consequently, in the invention, a thin metal or alloy coating layer comprising niobium or tantalum as at least part of the layer is bonded to a conductive substrate to produce a composite substrate and a diamond catalyst layer is formed thereon as a catalyst. Thus, a diamond electrode is obtained which is stable and is excellent in economical efficiency and specific strength. Furthermore, by reducing the amount of the niobium or tantalum, which are heavy, a reduction in electrode weight can be attained.

The conductive diamond electrode of the invention can be used as an anode and/or a cathode in various electrolytic reactions such as, e.g., the electrolysis of sodium chloride, treatment of a wastewater or other water, electrolytic production of ozone, hydrogen peroxide, persulfuric acid, percarbonic acid, or the like, and production of the electrolytic water.

Suitable examples of the material of the conductive substrate on which the metal or alloy coating layer is to be deposited include materials generally used as anode materials, such as pure titanium and commercial titanium alloys such as Ti-0.1Pd, Ti-6Al-4V, and Ti-5Ta. Materials other than titanium are usable. In this case, however, a suitable material is selected so that defects such as cracks and pinholes in the diamond layer are minimized.

Titanium has a solubility limit with each of tantalum and niobium. Because of this, when the coating layer formed is held at a high temperature to cause diffusion/bonding to proceed, a more tenacious bonding interface can be obtained between the substrate and the coating layer. In particular, a Ti—Ta or Ti—Nb alloy substrate already contains tantalum or niobium and, hence, has an excellent affinity for the coating layer to give a stable bonding interface having high evenness.

It is preferred to conduct chemical cleaning to the substrate surface with an acid or another chemical or physical cleaning as a pretreatment for the step of forming the metal or alloy coating layer thereon in view of required cleanness.

The shape of the conductive substrate is not limited to a plate, and the substrate may be in the form of particles, fibers, board, perforated board, etc. It is preferred to form concavo-convex portions each having a height of 0.001-1 mm on the surface of such substrate material by mechanical processing, blasting, etc. to thereby increase the effective electrode area.

Metal or alloy included in the metal or alloy coating layer is niobium, tantalum, or alloys containing at least one of these. The reasons for this are that the coating layer material preferably satisfies the following and other requirements. Since diamond synthesis conditions generally include a hydrogen atmosphere as will be described later, the material constituting the coating layer does not have the property of occluding hydrogen and is less apt to generate a hydride. Furthermore, the coating layer material forms a passive-state film which is stable to the corrosive liquid penetrating through cracks inevitably formed in the diamond layer when the electrode is used as an anode.

The content of the at least one of niobium and tantalum in the metal or alloy coating layer is preferably from 20% to 100% in terms of atomic percent (hereinafter referred to as at.%). In case where the content thereof is lower than 20 at.%, there are cases where resistance to oxidative corrosion and resistance to hydrogen become insufficient.

Besides niobium and tantalum, examples of metals which can be present in the metal or alloy coating layer include Ti, Zr, Mo, W, V, Sn, Ag, Al, Ni, Cu, Si, B, C, and O. These components can be purposely added to the tantalum and niobium for the coating layer in order to improve mechanical strength, corrosion resistance, and suitability for diamond film formation. Besides those elements are thus incorporated, a component of a compound in contact with the surface of the coating layer or a component of a reactant for diamond formation thermally diffuses from the coating layer surface and is alloyed with the tantalum and niobium in the coating layer during diamond film formation. Titanium and a titanium alloy component thermally diffuse from the substrate side to likewise form an alloy. Furthermore, a component of the brazing material, etc. may be alloyed with the tantalum and niobium during brazing.

Examples of methods for forming the even metal or alloy coating layer comprising niobium or tantalum include hot dipping, PVD, CVD, brazing, and explosive cladding.

The thickness of the metal or alloy coating layer to be deposited on the conductive substrate is as follows. In a method in which the layer thickness is gradually increased as in hot dipping, PVD, or CVD, the thickness of the coating layer preferably is 0.5 μm or larger from the standpoint of corrosion resistance and is 50 μm or smaller from the standpoints of production time and economical efficiency. In a method in which a thin sheet or foil is bonded as in brazing, the thickness of the coating layer preferably is 25 μm or larger from the standpoint of ease of handling and is not larger than 500 μm, which is a thickness which enables use not only as a covering material but as a substrate.

Hot dipping is a technique in which a substrate is immersed in a molten metal to adhere the molten metal to the substrate surface. According to need, an electric current is caused to flow in the adhesion step. In the case of tantalum, for example, it is known that $K_2TaF_7$ is dissolved in an LiF—NaF molten salt mixture and a direct current is permitted to flow at 800° C. to cause cathodic polarization, whereby a tantalum film having a given thickness can be formed on the substrate.

CVD, which is called chemical vapor deposition, is a film-forming technique generally used in semiconductor device production steps. This is a technique in which a metal salt vaporized at a low temperature is contacted with a solid heated at a high temperature to cause a pyrolysis reaction, hydrogen reduction reaction, high-temperature disproportionation reaction, etc. and thereby deposit the target metal or metal compound. For example, in the case where the hydrogen reduction reaction of an inorganic salt is utilized, niobium is deposited by repeating the conversion of $NbCl_5$ to $Nb_3Cl_8$ as a lower-order compound with hydrogen and the decomposition thereof through a high-temperature disproportionation reaction. On the other hand, tantalum is deposited directly by the reduction of $TaCl_5$ with hydrogen.

PVD includes vacuum deposition, sputtering, ion plating, and the like. An existing commercial apparatus can be used. The degree of vacuum, substrate temperature, target composition, and power are controlled, whereby the desired thin film can be obtained.

In vacuum deposition, the metal to be deposited is heated in a space having a reduced pressure and deposited on a substrate surface. The pressure is regulated generally in the range of $10^{-1}$-$10^{-2}$ Pa.

Sputtering has the following and other advantages over vacuum deposition: sputtering yields a film of a high-melting substance at low temperatures, can form an even film over a large area, is capable of conforming to alloy compositions, and has quick responsiveness and satisfactory controllability. Sputtering is hence spreading. In general, a rare gas such as argon is subjected to a glow discharge in a vacuum of about $10^{-0}$-$10^{-2}$ Pa and the ions generated are accelerated in an electric field and caused to collide against a target metal to deposit atoms of the target metal on the substrate to be coated. The vacuum is regulated in the range of $10^{-0}$-$10^{-2}$ Pa. Also known are direct-current sputtering, high-frequency sputtering, magnetron sputtering, and ion-beam sputtering, which generates no plasma.

Ion plating is a technique in which metal ions in a plasma state formed in a discharge in a reduced-pressure gas are accelerated under the influence of an electric field and deposited on a substrate negatively polarized. Compared to sputtering, ion plating can yield a film of satisfactory quality with respect to evenness of coverage and homogeneity.

Brazing is a technique in which a brazing material is sandwiched as an insert between a substrate and a covering material and then melted by heating to about 700-1,000° C. to bond the covering material to the substrate. In the case where tantalum, niobium, or an alloy of these is brazed to a titanium substrate, a reducing atmosphere or a vacuum is used and, hence, there is no need of using a flux. However, a pretreatment is preferably conducted thoroughly beforehand to sufficiently clean the surfaces to be bonded to each other. As the brazing material may be used a Ti—Ni—Cu or Ag—Al alloy, etc. Brazing has an advantage that the bonding/coating operation can be conducted in large quantities using a relatively simple apparatus and material without fail. However, when the brazed product is used as an electrode, care should be taken in contact with the electrolytic solution because the brazing material does not always have high corrosion resistance.

Explosive cladding is a technique in which a sheet of a metal or alloy is press-bonded to a substrate by the explosive force of an explosive. A substrate and a covering material are disposed parallel so as to be spaced apart at a proper distance. An explosive is placed over the whole upper surface of the covering material through a buffer. The covering material is caused to colloide with the substrate at a given angle by explosive energy so that the collision occurs from an edge and progresses across the material. As a result, a jet of the metal or alloy liquefied in a slight amount generates and bonding proceeds while the contaminants on the bonding surfaces are being blown off by the jet. Explosive cladding has merits that since the materials being bonded are kept cold, the substrate and the covering material each undergo no alteration in crystal structure and retain some degree of metallurgical consistency and that a wavy interface is obtained in which the crests bite into the respective mating materials. This technique, however, has a drawback that the covering material should be thick.

It is also possible to deposit the metal or alloy coating layer by using a combination of two or more of the techniques described above.

After the substrate having the metal or alloy coating layer formed thereon is thus produced, a conductive diamond layer is formed on the surface of the metal or alloy coating layer. Since this substrate has resistance to a reducing hydrogen atmosphere, diamond can be directly deposited by ordinary CVD.

In the case where diamond coating by CVD is conducted, it is desirable that the surface of the metal or alloy coating layer be subjected, before the coating, to a marring treatment and seeding treatment with fine diamond particles and an ultrasonic generator for the purpose of improving the density of diamond nuclei to be generated.

Prior to the seeding treatment, concavo-convex portions each having a diameter in the range of 30-150 nm may be imparted to the surface of the metal or alloy coating layer in order to improve the mechanical strength at the interface between the metal or alloy coating layer and the diamond layer as a catalyst. For this impartation, use can be made of a method such as etching with an ordinary acid, blasting, or vacuum heat treatment. As a pretreatment for CVD, it is preferred to conduct chemical/physical cleaning with an acid or another chemical.

An explanation is given below on the formation of a conductive diamond layer by a typical technique of the hot-filament CVD method.

An organic material serving as a carbon source, such as a hydrocarbon gas, e.g., methane $CH_4$, or an alcohol, is introduced into a CVD chamber together with hydrogen gas. While the atmosphere in the chamber is kept being a reducing atmosphere, the filament is heated to heat the atmosphere to a temperature at which carbon radicals generate, i.e., 1,800-2,400° C. The conductive substrate on which the metal or alloy coating layer has been formed is set in a zone having a temperature (750-950° C.) at which diamond deposition occurs. The concentration of the hydrocarbon gas is preferably 0.1 to 10 vol % substrated on the hydrogen, and the pressure is preferably 20 hPa to 1,013 hPa (1 atm).

In order to obtain diamond having satisfactory conductivity, it is preferable to add a slight amount of an element differing in valence. The content of boron (B) or phosphorus (P) is preferably 1-100,000 ppm, more preferably 100-10,000 ppm. Trimethylboron $(CH_3)_3B$ can be used as a raw-material compound. It is also preferred to use a less toxic compound such as boron oxide $B_2O_3$ or diphosphorus pentoxide $P_2O_5$.

It is known that the outermost metal surface partly undergoes carbide synthesis due to the diamond synthesis process. Since this carbide is unstable when the electrode is used as an oxygen-generating anode in an aqueous solution, it is preferable to regulate the CVD conditions so as to minimize the carbide formation.

As described above, the conductive diamond electrode of the invention has a metal or alloy coating layer comprising at least one of niobium and tantalum and disposed between the conductive substrate and the conductive diamond layer.

This metal or alloy coating layer contributes to an improvement in substrate stability even when niobium or tantalum is used in a relatively small amount. A considerable cost reduction is hence possible as compared with the case where the substrate itself is constituted of niobium or tantalum. Thus, a diamond electrode is obtained which is stable, excellent in economical efficiency and specific strength, and lightweight.

Figure 1:
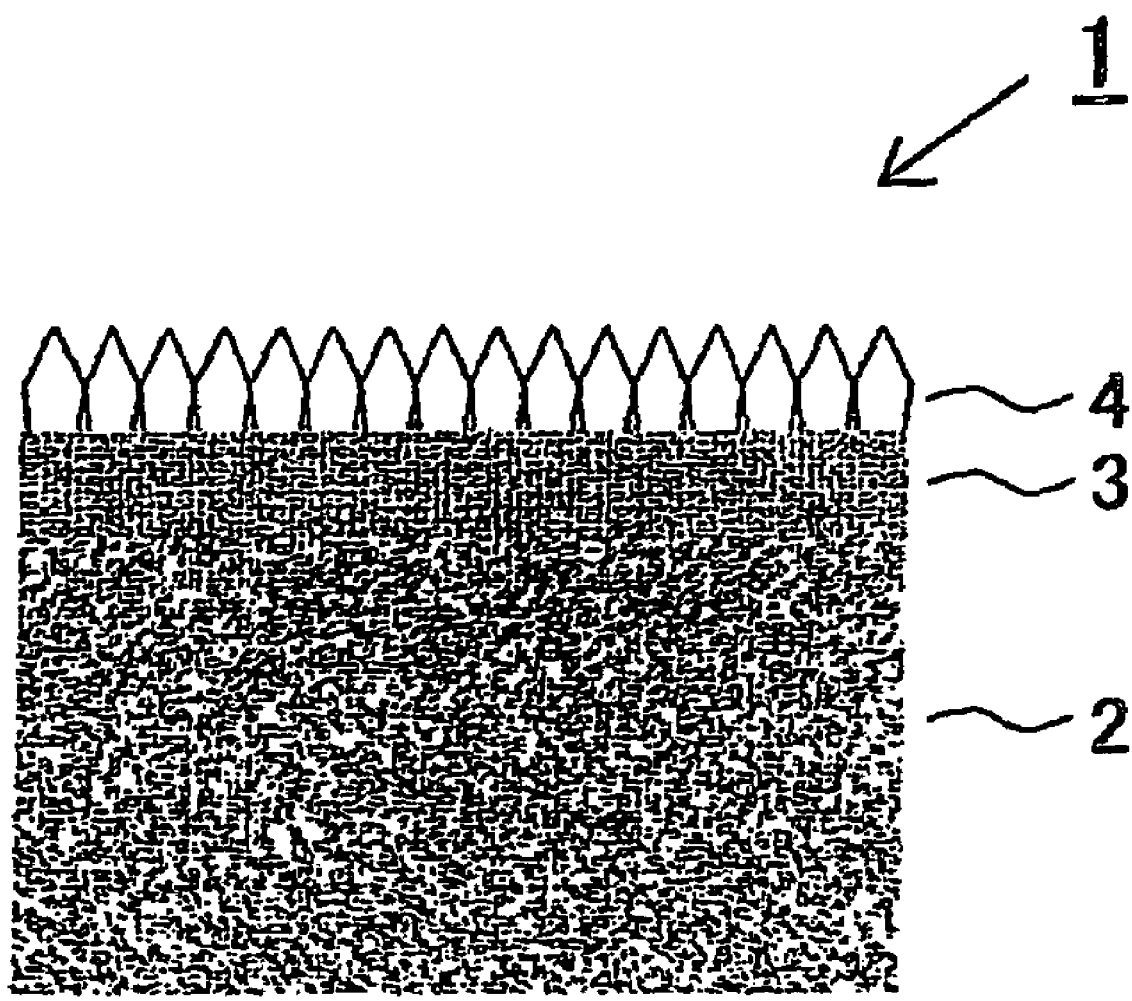
FIG. 1 is a diagrammatic vertical sectional view illustrating one embodiment of the conductive diamond electrode of the invention.

The reference numerals used in the drawings denote the followings, respectively.
1 conductive diamond electrode
2 conductive substrate
3 metal or alloy coating layer
4 conductive diamond particles (conductive diamond layer)

DETAILED DESCRIPTION OF THE INVENTION

One embodiment of the conductive diamond electrode of the invention will be explained by reference to the accompanying drawing.

As shown in FIG. 1, the conductive diamond electrode 1 comprises: a conductive substrate 2 having a relatively large thickness; a metal or alloy coating layer 3 having a small thickness deposited on the surface of the substrate 2; and a conductive diamond layer formed on the surface of the coating layer 3 by depositing many conductive diamond particles 4 by CVD or another method.

The conductive substrate 2 desirably is made of pure titanium or a titanium alloy. Titanium is inexpensive and suitable for electrode size enlargement. The metal or alloy coating layer comprises niobium, tantalum, or an alloy of these, and the niobium and/or tantalum accounts for at least 20 at.% of the coating layer. This coating layer 3 usually is far thinner than the substrate 2. Consequently, although at least either of niobium and tantalum, which are expensive, is used, not only the cost increase attributable thereto is slight but the increase in weight caused by the niobium and/or tantalum, which have a high specific gravity, can be inhibited.

Subsequently, a conductive diamond layer 4 is formed on the metal or alloy coating layer 3 by CVD or another method. In this operation, since the conductive substrate 2 is protected with the highly corrosion-resistant coating layer 3 comprising niobium or tantalum, the substrate 2 hardly deteriorates even when the conductive diamond layer is formed under relatively severe conditions.

The conductive diamond electrode 1 thus obtained has satisfactory durability even when used as an anode, because the conductive substrate 2 is protected with the metal or alloy coating layer 3. The electrode 1 hence enables long-term stable electrolysis.

EXAMPLES

The following are Examples and Comparative Examples concerning the production of conductive diamond electrodes according to the invention and the performance evaluation of the conductive diamond electrodes. However, the invention should not be construed as being limited to the following Examples.

Example 1

A titanium plate was blasted using an iron grit, acid-washed with 20% boiling hydrochloric acid, and then rinsed with pure water to obtain a conductive substrate.

This substrate was set in a CVD apparatus. In a hydrogen stream, tantalum chloride ($TaCl_5$) was vaporized at 300° C. and a tantalum layer was deposited in a thickness of 8 μm on the titanium substrate held at 1,000° C. As a post-treatment, a hydrogen elimination treatment was conducted in which the substrate was held at 700° C. in a vacuum of $10^{-3}$ Pa.

The substrate was taken out. The surface of this substrate was subjected to a marring/seeding treatment with an abrasive material comprising fine diamond particles. Thereafter, the substrate was set again in the CVD apparatus. In a hydrogen stream, methane ($CH_4$) as a carbon source and trimethylboron (($CH_3$)$_3$B) as a boron B source were added. A current was permitted to flow through the filament to heat the atmosphere to a temperature of 2,000-2,300° C., i.e., a temperature for carbon radical generation. The temperature of the substrate located just under the filament was measured and was found to be 800° C.

The CVD operation was continued for 5 hours and the substrate was then taken out. It was ascertained through spectroanalysis that a diamond layer had deposited. The thickness of this layer was 3 μm and the concentration of boron as a dopant was 1,300 ppm.

A piece having an area of 1 $cm^2$ was cut out of the electrode thus produced, and was used as an anode. Using the anode together with a zirconium plate as a counter electrode, electrolysis was conducted in 150 g/L sulfuric acid under the conditions of an electrode spacing of 1 cm, 60° C., and 2 A/$cm^2$. As a result, a stable cell voltage was maintained for 4,000 hours. The diamond electrode was ascertained to be usable over long periods.

Example 2

A titanium substrate obtained through the same treatments as in Example 1 was set in a high-frequency sputtering apparatus. A tantalum plate was used as a target, and a discharge was continued by supplying a power for 90 minutes in an argon atmosphere of $10^{-0}$ Pa. Thus, a tantalum layer was deposited in a thickness of 10 μm on the substrate.

Subsequently, a conductive diamond layer was formed on the substrate in the same manner as in Example 1.

The same electrolysis test as in Example 1 was conducted. As a result, a stable cell voltage was maintained for 4,500 hours. The diamond electrode was ascertained to be usable over long periods.

Example 3

Sputtering was conducted under the same conditions as in Example 2, except that a niobium plate was used as a target. Thus, a niobium layer was deposited in a thickness of 10 μm on the titanium substrate. Furthermore, a conductive diamond layer was formed on the substrate in the same manner as in Example 1.

The same electrolysis test as in Example 1 was conducted. As a result, a stable cell voltage was maintained for 3,800 hours. The diamond electrode was ascertained to be usable over long periods.

Example 4

Sputtering was conducted under the same conditions as in Example 2, except that a Ta—Nb alloy (1:1 in terms of atomic ratio) was used as a target. Thus, a Ta—Nb alloy layer was deposited in a thickness of 10 μm on the titanium substrate. Furthermore, a conductive diamond layer was formed on the substrate in the same manner as in Example 1.

The same electrolysis test as in Example 1 was conducted. As a result, a stable cell voltage was maintained for 4,000 hours. The diamond electrode was ascertained to be usable over long periods.

Example 5

A Ti-5Ta plate was blasted using an iron grit, acid-washed with 20% boiling hydrochloric acid, and then rinsed with pure water to obtain a conductive substrate.

On this substrate was deposited a tantalum layer in a thickness of 10 μm under the same conditions as in Example 2. Furthermore, a conductive diamond layer was formed on the substrate in the same manner as in Example 1.

The same electrolysis test as in Example 1 was conducted. As a result, a stable cell voltage was maintained for 4,800 hours. The diamond electrode was ascertained to be usable over long periods.

Example 6

A titanium mesh (6 mm LM×3.6 mm SW×1.2 mm ST; thickness, 1.0 mm) was blasted using an iron grit, acid-washed with 20% boiling hydrochloric acid, and then rinsed with pure water to obtain a conductive substrate.

This conductive substrate was set in an ion plating apparatus operating by the arc discharge method. A tantalum plate was used as a target, and a discharge was continued by supplying a power for 100 minutes in a vacuum of $10^{-2}$ Pa. Thus, a tantalum layer was deposited in a thickness of 10 μm on the substrate. It was ascertained that tantalum had deposited almost evenly on the front and back sides of the mesh and on inner surfaces thereof. Furthermore, a conductive diamond layer was formed on the substrate in the same manner as in Example 1.

The same electrolysis test as in Example 1 was conducted. As a result, a stable cell voltage was maintained for 5,500 hours. The diamond electrode was ascertained to be usable over long periods.

Example 7

A titanium plate having a thickness of 2 mm which had been pretreated in the same manner as in Example 1 was used as a substrate. A Ti-15Ni-15Cu foil having a thickness of 25 μm was placed as a brazing material on the substrate, and a tantalum foil having a thickness of 50 μm was further placed thereon as a covering material. The tantalum foil as a covering material had been pretreated by acid-washing with ordinary-temperature nitric-hydrofluoric acid and subsequent rinsing with pure water.

The resultant assemblage was heated to 960° C. in a vacuum of $10^{-3}$ Pa while applying a pressure of 5 g/cm$^2$ thereto with a molybdenum plate to thereby form a tantalum coating layer having a thickness of 50 μm on the titanium substrate. Furthermore, a conductive diamond layer was formed on the substrate in the same manner as in Example 1.

The same electrolysis test as in Example 1 was conducted. As a result, a stable cell voltage was maintained for 5,200 hours. The diamond electrode was ascertained to be usable over long periods.

Comparative Example 1

A conductive diamond layer having a thickness of 10 μm was formed, under the same conditions as in Example 1, directly on a titanium substrate which had undergone the same pretreatment as in Example 1.

The same electrolysis test as in Example 1 was conducted. As a result, the electrolysis life was 500 hours. Peeling of the diamond layer had proceeded and the substrate had corroded.

Comparative Example 2

A titanium substrate which had been pretreated under the same conditions as in Example 1 was set in a CVD apparatus. In an argon stream, niobium pentachloride NbCl$_5$ gas and methane CH$_4$ gas were introduced to deposit an Nb—C layer in a thickness of 2 μm on the substrate held at 850° C. Thereafter, the substrate was taken out and analyzed by X-ray diffractometry. As a result, NbC and Nb$_2$C were identified.

An abrasive material comprising fine diamond particles was used to conduct a marring/seeding treatment of the substrate surface. Thereafter, the substrate was set again in the CVD apparatus. In a hydrogen stream, methane (CH$_4$) as a carbon source and trimethylboron ((CH$_3$)$_3$B) as a boron B source were added. A current was permitted to flow through the filament to form a diamond layer having a thickness of 10 μm in the same manner.

The same electrolysis test as in Example 1 was conducted. As a result, the voltage increased abruptly after 800 hours. The cell was disassembled for examination. As a result, it was found that peeling of the diamond layer had proceeded and the substrate had corroded.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2005-222974 filed on Aug. 1, 2005, and the contents thereof are incorporated herein by reference.

What is claimed is:

1. A conductive diamond electrode comprising:
   a conductive substrate;
   a coating layer formed on a surface of the conductive substrate, the coating layer comprising one of a metal and an alloy each comprising at least one of niobium and tantalum; and
   a conductive diamond layer formed on a surface of the coating layer,
   wherein the surface of the coating layer has concavo-convex portions each having a diameter of 30 to 150 nm.

2. The conductive diamond electrode according to claim 1, wherein the conductive substrate comprises one of titanium and a titanium alloy.

3. The conductive diamond electrode according to claim 1, wherein the coating layer has a content of the at least one of niobium and tantalum of 20 to 100 at.%.

4. The conductive diamond electrode according to claim 1, wherein the alloy further contains at least one element selected from the group consisting of Ti, Zr, Mo, W, V, Sn, Ag, Al, Ni, Cu, Si, B, C, and O.

5. A process for producing a conductive diamond electrode, the process comprising:
   forming a coating layer on a surface of a conductive substrate by at least one method selected from the group consisting of hot dipping method, CVD method, PVD method and brazing method, the coating layer comprising one of a metal and an alloy each comprising at least one of niobium and tantalum; and
   forming a conductive diamond layer on a surface of the coating layer,
   wherein the surface of the coating layer has concavo-convex portions each having a diameter of 30 to 150 nm.

* * * * *